(12) United States Patent
Chung

(10) Patent No.: US 7,911,030 B2
(45) Date of Patent: Mar. 22, 2011

(54) RESISTIVE MEMORY DEVICE AND METHOD OF FABRICATING THE SAME

(75) Inventor: Su-Ock Chung, Icheon-si (KR)

(73) Assignee: Hynix Semiconductor Inc., Icheon-si, Gyeonggi-do (KR)

( * ) Notice: Subject to any disclaimer, the term of this patent is extended or adjusted under 35 U.S.C. 154(b) by 55 days.

(21) Appl. No.: 12/344,479

(22) Filed: Dec. 27, 2008

(65) Prior Publication Data

US 2010/0019218 A1 Jan. 28, 2010

(30) Foreign Application Priority Data

Jul. 24, 2008 (KR) ........................ 10-2008-0072477

(51) Int. Cl.
 *H01L 29/94* (2006.01)
 *H01L 27/108* (2006.01)
(52) U.S. Cl. . 257/536; 257/295; 257/296; 257/E27.084; 257/E27.104; 257/E21.662; 438/3; 438/238
(58) Field of Classification Search .............. 257/4, 261, 257/390, E27.104, 295, 296, 536, E27.084, 257/E29.164, E21.662, E21.208; 365/100, 365/184; 438/3, 238, FOR. 212, FOR. 349
See application file for complete search history.

(56) References Cited

U.S. PATENT DOCUMENTS

| 5,858,831 | A * | 1/1999 | Sung | 438/241 |
| 6,303,433 | B1 * | 10/2001 | Kuo | 438/254 |
| 6,627,969 | B1 * | 9/2003 | Jain et al. | 257/530 |
| 2001/0029105 | A1 * | 10/2001 | Seta et al. | 438/694 |

FOREIGN PATENT DOCUMENTS

| KR | 10-0824761 | 1/2007 |
| KR | 100755141 | 8/2007 |
| KR | 1020080035212 | 4/2008 |

OTHER PUBLICATIONS

*Multi-layer Cross-point Binary Oxide Resistive Memory (OxRRAM) for Post-NAND Storage Application;* I. G. Baek et al.
Korean Office Action for Korean application No. 10-2008-0072477.
Korean Notice of Allowance for application No. 10-2008-0072477.

* cited by examiner

*Primary Examiner* — Matthew S Smith
*Assistant Examiner* — Quovaunda Jefferson
(74) *Attorney, Agent, or Firm* — Lowe Hauptman Ham & Berner LLP

(57) ABSTRACT

A resistive memory device includes: a substrate, an insulation layer arranged over the substrate, a first electrode plug penetrating the insulation layer from the substrate, having a portion protruded out of an upper portion of the insulation layer, and having peaks at edges of the protruded portion, a resistive layer disposed over the insulation layer and covering the first electrode plug, and a second electrode arranged over the resistive layer.

18 Claims, 5 Drawing Sheets

RESISTIVE MEMORY DEVICE AND METHOD OF FABRICATING THE SAME

CROSS-REFERENCE TO RELATED APPLICATIONS

The present application claims priority of Korean patent application number 10-2008-0072477, filed on Jul. 24, 2008, which is incorporated herein by reference in its entirety.

BACKGROUND

The disclosure relates to a semiconductor device fabrication technology, and more particularly, to a resistive memory device using resistance variations such as a non-volatile Resistive Random Access Memory (ReRAM), and a fabrication method thereof.

Recently, researchers have been studying next-generation memory devices that can substitute for Dynamic Random Access Memory (DRAM) and flash memory.

Among the next-generation memory devices is a resistive memory device which takes advantage of a property of a resistive layer that can switch between at least two different resistance states by a drastic change in resistance in response to a bias applied to the resistive layer.

A structure of such a resistive memory device and a switching mechanism thereof will be described briefly hereinafter.

A resistive memory device generally includes an upper electrode, a lower electrode, and a resistive layer disposed between the upper and lower electrodes. The resistive layer includes binary oxides or perovskite-based materials. When a predetermined level of bias is applied to the upper and lower electrodes, an oxygen vacancy filament may be generated in the resistive layer or a previously generated oxygen vacancy filament may disappear according to the applied bias. The oxygen vacancy filament functions as an electric current path. When an oxygen vacancy filament is generated, it signifies a set mode with low resistance. When an oxygen vacancy filament disappears, it signifies a reset mode with high resistance.

To reduce the reset current (Ireset) of such resistive memory device, Baek, I. G. et al. suggested forming a lower electrode in the form of a plug to reduce the contact area between the resistive layer and the lower electrode in an article entitled "Multi-layer Cross-point Binary Oxide Resistive Memory (OxRRAM) for Post-NAND Storage Application," *Electron Devices Meeting, IEDM Technical Digest, IEEE*, 2005 which is incorporated by reference herein in its entirety.

However, since oxygen vacancy filaments are generated irregularly, the resistive memory device does not show a uniform characteristics distribution, such as a voltage/current distribution in the set/reset mode. This problem of non-uniform characteristics distribution becomes worse as resistive memory devices are miniaturized.

SUMMARY

In accordance with an embodiment a resistive memory device includes: a substrate; an insulation layer arranged over the substrate; a first electrode plug penetrating the insulation layer from the substrate, having a portion protruded out of an upper portion of the insulation layer, and having peaks at edges of the protruded portion; a resistive layer disposed over the insulation layer and covering the first electrode plug; and a second electrode arranged over the resistive layer.

In accordance with another embodiment a method of fabricating a resistive memory device includes: forming an insulation layer over a substrate; forming a first electrode plug, with a dishing on a top surface thereof, through the insulation layer; removing a portion of the insulation layer around the first electrode plug to thereby protrude a top portion of the first electrode plug; forming a resistive layer covering the first electrode plug; and forming a second electrode over the resistive layer.

DESCRIPTION OF EMBODIMENTS

Figure 1A:
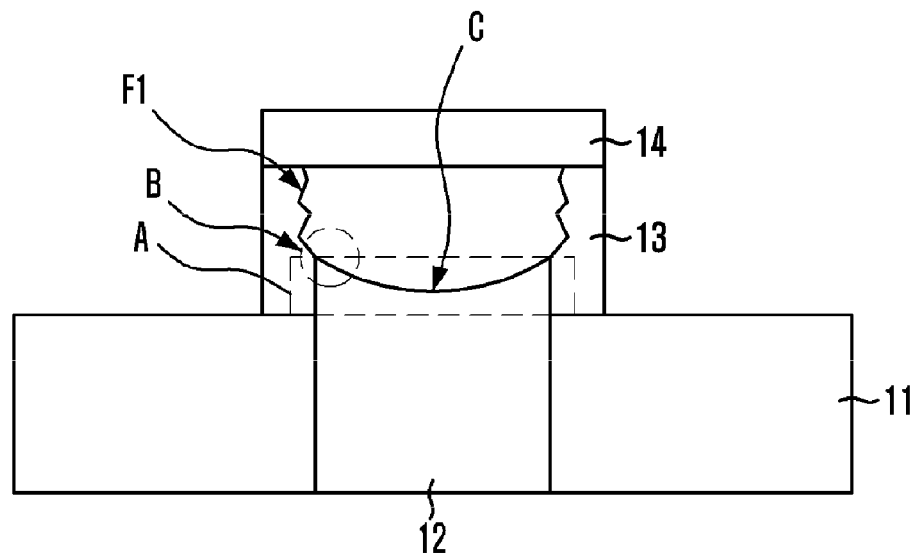
FIG. 1A is a cross-sectional view of a resistive memory device in accordance with an embodiment.

In the figures, the dimensions of layers and regions are exaggerated for clarity of illustration. It will also be understood that when a layer (or film) is referred to as being 'on' another layer or substrate, it can be directly on the other layer or substrate, or intervening layers may also be present. Further, it will be understood that when a layer is referred to as being 'under' another layer, it can be directly under, and one or more intervening layers may also be present. In addition, it will also be understood that when a layer is referred to as being 'between' two layers, it can be the only layer between the two layers, or one or more intervening layers may also be present. Like reference numerals refer to like elements throughout the drawings.

Figure 1B:
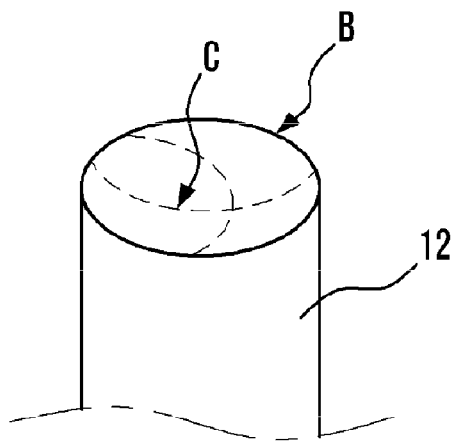
FIG. 1B is a perspective view depicting the shape of the lower electrode 12 of the resistive memory device shown in FIG. 1.

FIGS. 1A and 1B are cross-sectional and partial, perspective views, respectively, of a resistive memory device in accordance with an embodiment. Particularly, FIGS. 1A and 1B disclose a resistive memory device employing a plug-type lower electrode.

The resistive memory device includes an insulation layer 11 formed over a substrate (not shown) provided with a predetermined lower structure, a lower electrode 12 having the form of a plug and penetrating the insulation layer 11 to contact the substrate, a resistive layer 13 formed over the insulation 11 and covering the lower electrode 12, and an upper electrode 14 formed over the resistive layer 13.

Particularly, a portion of the lower electrode 12 is protruded out of the upper portion of the insulation layer 11 (see 'A' in FIG. 1A), and the edges of the protruded portion has sharp peaks (see 'B' in FIGS. 1A and 1B). The central portion of the lower electrode 12 is concavely sunken-in (see 'C' in FIGS. 1A and 1B) and surrounded by the edges. FIG. 1B is a perspective view showing the form of the lower electrode 12. In this embodiment, the lower electrode 12 is formed in a cylindrical shape.

The insulation layer 11 may be a single layer or a multi-layer structure where a plurality of layers are stacked one upon another. The insulation layer 11 in some embodiments is formed of an oxide layer, a nitride layer, or a stack of an oxide layer and a nitride layer. Also, in some embodiments, the lower electrode 12 and/or the upper electrode 14 is/are formed of a metal layer, and the resistive layer 13 includes a binary oxide such as $MgO$, $ZnO$, $TiO_2$, $NiO$, $SiO_2$, $Nb_2O_5$, HfO$_2$ and the like, or a perovskite-based material such as PCMO(PrCaMnO$_3$) and LCMO(LaCaMnO$_3$).

Figure 2:
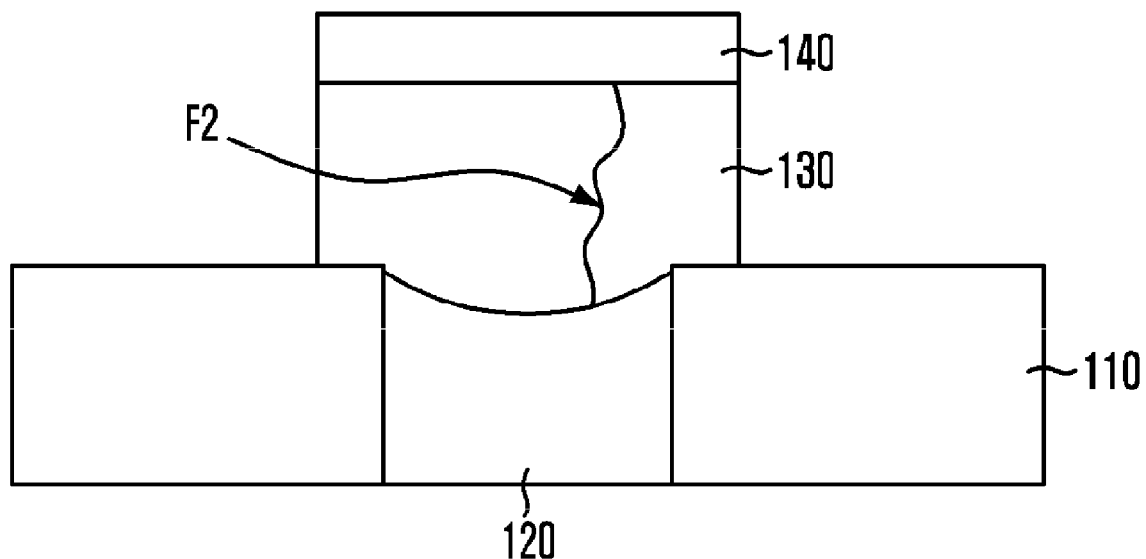
FIG. 2 is a cross-sectional view of a known resistive memory device.

Hereinafter, the operation of the resistive memory device will be described in comparison with that of a known resistive memory device shown in FIG. 2. FIG. 2 is a cross-sectional view of a resistive memory device known to the inventor(s).

In FIG. 2, the known resistive memory device includes an insulation layer 110, a lower electrode 120 having a form of a plug and penetrating the insulation layer 110 to contact an underlying substrate (not shown), a resistive layer 13 formed over the insulation layer 110 and covering the lower electrode 120, and an upper electrode 140 over the resistive layer 130. Thus, the lower electrode 120 is buried in the insulation layer 110.

During the operation of the known resistive memory device of FIG. 2, an oxygen vacancy filament (F2) can be generated in any portion of the resistive layer 130 that contacts the lower electrode 120. Therefore, the oxygen vacancy filament (F2) is formed irregularly and this phenomenon causes the known resistive memory device's characteristics to be distributed non-uniformly.

In the resistive memory device of FIGS. 1A and 1B, however, since an electric field is concentrated to the peaks (see 'B') at the edges of the lower electrode 12 protruded out of the upper portion of the insulation layer 11, an oxygen vacancy filament (F1) is consistently formed in a portion of the resistive layer 13 where the peaks (B) are positioned. Therefore, it is possible to regularly control the generation of the oxygen vacancy filament (F1) and, as a result, the resistive memory device's characteristics are distributed uniformly.

FIGS. 3A to 3F are cross-sectional views describing a method of fabricating a resistive memory device in accordance with an embodiment.

Figure 3A:
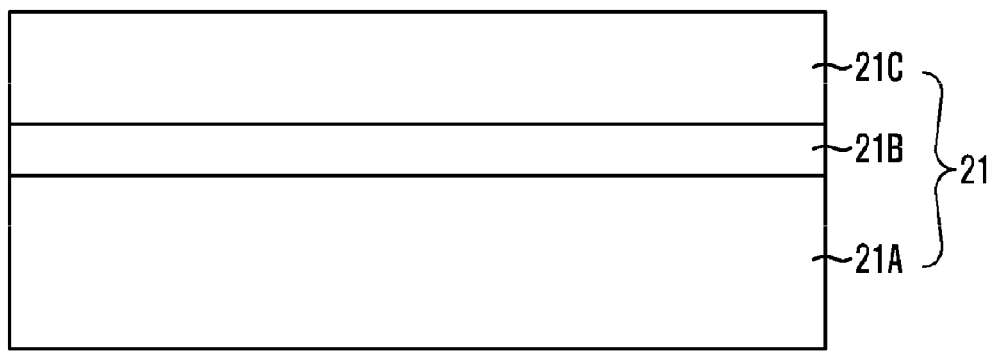
FIGS. 3A to 3F are cross-sectional views describing a method of fabricating a resistive memory device in accordance with an embodiment.

In FIG. 3A, an insulation layer 21 is formed over a substrate (not shown) with a predetermined lower structure formed therein. In this embodiment, the insulation layer 21 has a structure where a first oxide layer 21A, a nitride layer 21B and a second oxide layer 21C are stacked one upon another, but other arrangements are not excluded. For example, it is also possible to use an insulation layer of a structure where a nitride layer/an oxide layer/a nitride layer are stacked one upon another sequentially, or an insulation layer of a structure including two layers of different etch selectivities, or an insulation layer consisting of a single layer.

Figure 3B:
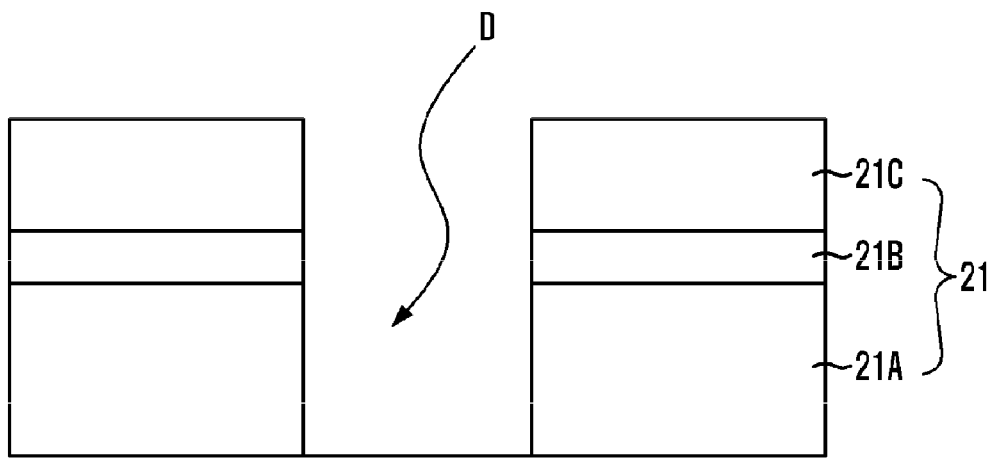

In FIG. 3B, a lower electrode region (D) is formed by selectively etching the insulation layer 21 until the substrate is exposed through the insulation layer 21. The lower electrode region (D) in some embodiments is formed in a hole type.

Figure 3C:
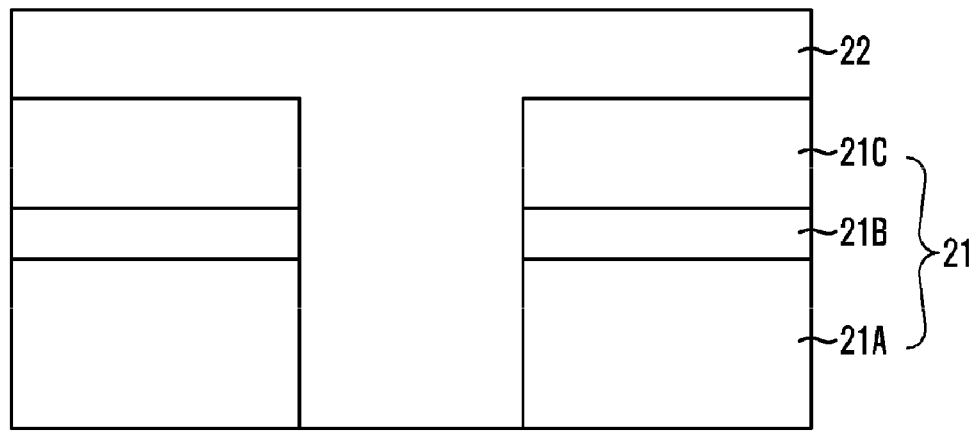

In FIG. 3C, a conductive layer 22 for a lower electrode, e.g., a metal layer, is formed over the resultant structure with the lower electrode region (D) in a thickness that sufficiently fills in the lower electrode region (D). In some embodiments, the conductive layer 22 includes a metal layer such as tungsten (W).

Figure 3D:
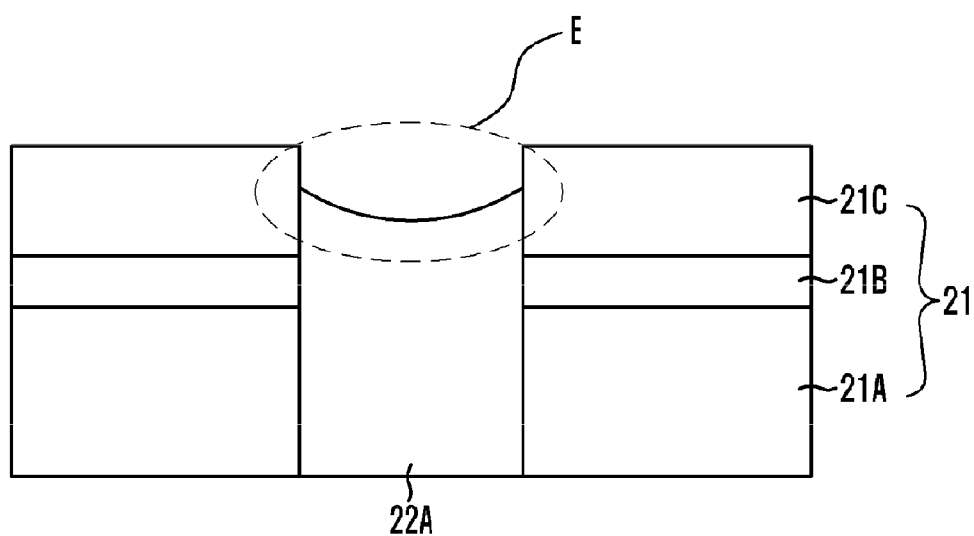

In FIG. 3D, the conductive layer 22 is etched back until the second oxide layer 21C is exposed to thereby form a lower electrode 22A. The etch-back target is controlled properly so that the central portion of the lower electrode 22A is sunken-in concavely compared to the edges thereof, while making the top surface of the lower electrode 22A lower than the top surface of the second oxide layer 21C. As a result, dishing (E) is formed. The etch-back process in some embodiments is performed at a pressure of scores of mT in the atmosphere of SF$_6$/O$_2$/Ar or Cl$_2$/Ar, and/or with an over-etched target in the substantially same thickness as the thickness of the conductive layer 22 above the insulation layer 21.

Figure 3E:
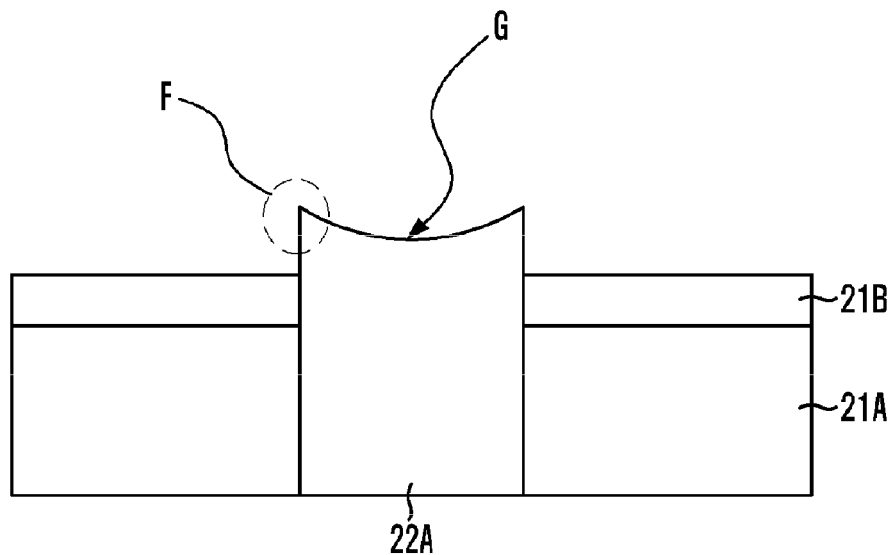

In FIG. 3E, the second oxide layer is removed. The second oxide layer can be easily removed by a wet ringing process using a buffered oxide etchant (BOE) solution or an HF solution.

As a result of the process disclosed in the drawings, a portion of the lower electrode 22A with dishing E is protruded out of the upper portion of the nitride layer 21B, and the edges of the protruded portion of the lower electrode 22A, due to the dishing effect, have sharp peaks (F) while the central portion of the lower electrode 22A has a shape (G) sunken-in concavely.

Meanwhile, when the insulation layer 21 has a structure wherein the first oxide layer 21A, the nitride layer 21B and the second oxide layer 21C are stacked one upon another, the process of removing the second oxide layer 21C, which is illustrated in FIG. 3E, is performed to easily protrude the lower electrode 22A, but other arrangements are not excluded. Although not illustrated in the drawings, when the insulation layer has a structure where a nitride layer/an oxide layer/a nitride layer are stacked one upon another sequentially, the lower electrode 22A can be protruded by removing the uppermost nitride layer with phosphoric acid through a wet ringing. Also, when the insulation layer is formed in a two-layer structure of a nitride layer/an oxide layer or an oxide layer/a nitride layer, the uppermost layer can be easily removed through a wet ringing. When the insulation layer is formed of a single layer, e.g., an oxide layer or a nitride layer, the lower electrode 22A can be formed to be protruded through a dry-etch process targeting the protrusion height of the lower electrode 22A.

Figure 3F:
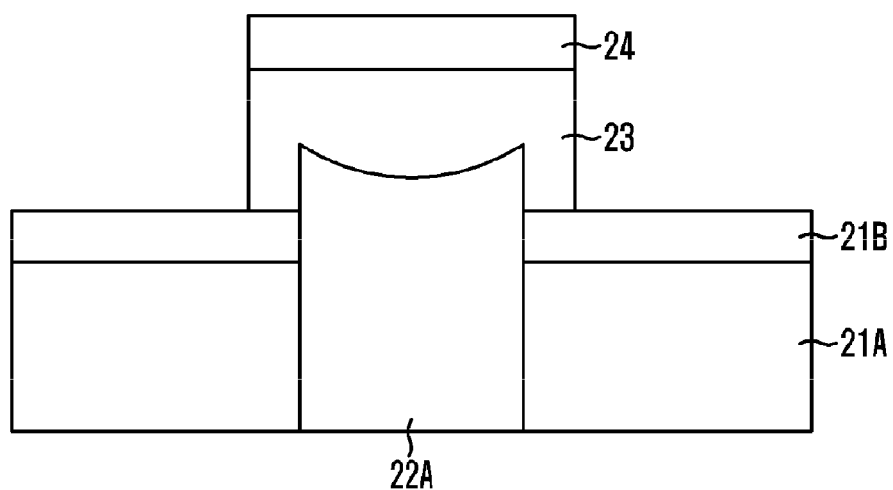

In FIG. 3F, a material layer, e.g., a binary oxide layer or a perovskite-based material layer, which is used as a resistive layer, and a conductive layer for an upper electrode are formed over the resultant structure with the lower electrode 22A. Then, a resistive layer 23 and an upper electrode 24 are formed to cover the lower electrode 22A by patterning the material layer and the conductive layer for an upper electrode.

While exemplary embodiments have been described, it will be apparent to those skilled in the art that various changes and modifications may be made without departing from the spirit and scope of the disclosure.

What is claimed is:

1. A resistive memory device, comprising:
    a substrate;
    an insulation layer arranged over the substrate;
    a first electrode plug penetrating the insulation layer from the substrate, having a portion protruded out of an upper portion of the insulation layer, and having peaks at edges of the protruded portion;
    a resistive layer disposed over the insulation layer and covering the first electrode plug; and
    a second electrode arranged over the resistive layer,
    wherein an oxygen vacancy filament is formed in operation in a portion of the resistive layer where the peaks are positioned in response to a voltage applied between the first electrode plug and the second electrode.

2. The resistive memory device of claim 1, wherein the resistive layer includes a binary oxide or a perovskite-based material.

3. The resistive memory device of claim 1, wherein the first electrode plug further has a concavely sunken-in central portion surrounded by the edges.

4. The resistive memory device of claim 3, wherein the concavely sunken-in central portion comprises a dishing.

5. The resistive memory device of claim 3, wherein a lowermost point of said concavely sunken-in central portion is equal to or higher than a top surface of the insulation layer.

6. The resistive memory device of claim 3, wherein a lowermost point of said concavely sunken-in central portion is lower than a top surface of the insulation layer.

7. The resistive memory device of claim 1, wherein the insulation layer comprises a stack of multiple layers having different etch selectivities.

8. The resistive memory device of claim 7, wherein the insulation layer comprises a stack of an oxide layer and a nitride layer.

9. A method of fabricating a resistive memory device, said method comprising:
forming an insulation layer over a substrate;
forming a first electrode plug, with a dishing on a top surface thereof, through the insulation layer;
removing a portion of the insulation layer around the first electrode plug to thereby protrude a top portion of the first electrode plug;
forming a resistive layer covering the first electrode plug;
forming a second electrode over the resistive layer; and
forming an oxygen vacancy filament in a portion of the resistive layer where peaks are positioned in response to a voltage applied between the first electrode plug and the second electrode.

10. The method of claim 9, wherein the forming of the first electrode plug comprises:
forming a first electrode plug region exposing the substrate by selectively patterning the insulation layer;
forming a conductive layer over a resultant structure including the first electrode plug region; and
performing an etch-back process on the conductive layer until the insulation layer is exposed and the dishing is formed on the top surface of the conductive layer.

11. The method of claim 10, wherein the etch-back process is performed with an over-etch target set to be substantially the same as a thickness of the conductive layer above the insulation layer.

12. The method of claim 9, wherein
the insulation layer is formed of multiple layers, and
the removing of the portion of the insulation layer around the first electrode plug is performed to remove at least an uppermost layer among the multiple layers.

13. The method of claim 12, wherein the uppermost layer and an underlying layer contacting the uppermost layer have different etch selectivities.

14. The method of claim 13, wherein the uppermost layer is an oxide layer, and the underlying layer contacting the uppermost layer is a nitride layer.

15. The method of claim 14, wherein the removing of the portion of the insulation layer around the first electrode plug is performed through a wet ringing using a buffered oxide etchant (BOE) or an HF solution.

16. The method of claim 13, wherein the uppermost layer is a nitride layer, and the underlying layer contacting the uppermost layer is an oxide layer.

17. The method of claim 16, wherein the removing of the portion of the insulation layer around the first electrode plug is performed through a wet ringing using a phosphoric acid solution.

18. The method of claim 9, wherein the resistive layer includes a binary oxide or a perovskite-based material.

* * * * *